(12) United States Patent
Tempelaars et al.

(10) Patent No.: US 7,502,096 B2
(45) Date of Patent: Mar. 10, 2009

(54) LITHOGRAPHIC APPARATUS, CALIBRATION METHOD, DEVICE MANUFACTURING METHOD AND COMPUTER PROGRAM PRODUCT

(75) Inventors: Jeffrey Godefridus Cornelis Tempelaars, Eindhoven (NL); Gerardus Carolus Johannus Hofmans, Eindhoven (NL); Rene Oesterholt, 's-Hertogenbosch (NL); Jan Hauschild, Eindhoven (NL); Hans Erik Kattouw, Nijmegen (NL)

(73) Assignee: ASML Netherlands B.V., Veldhoven (NL)

( * ) Notice: Subject to any disclaimer, the term of this patent is extended or adjusted under 35 U.S.C. 154(b) by 247 days.

(21) Appl. No.: 11/348,530

(22) Filed: Feb. 7, 2006

(65) Prior Publication Data

US 2007/0181827 A1   Aug. 9, 2007

(51) Int. Cl.
*G02B 27/42* (2006.01)

(52) U.S. Cl. .............................. 355/53; 355/72; 355/75

(58) Field of Classification Search .................. 118/712; 355/53, 55, 72, 75; 430/5
See application file for complete search history.

(56) References Cited

U.S. PATENT DOCUMENTS

| 4,391,511 | A  | * | 7/1983  | Akiyama et al. | ............... | 355/40 |
| 6,674,510 | B1 | * | 1/2004  | Jasper et al. | .................. | 355/55 |
| 2002/0142493 | A1 | * | 10/2002 | Halliyal et al. | ................ | 438/14 |
| 2002/0158185 | A1 | * | 10/2002 | Nelson et al. | ............ | 250/201.2 |
| 2004/0005507 | A1 | * | 1/2004  | Lakkapragada et al. | ....... | 430/30 |
| 2005/0134816 | A1 | * | 6/2005  | Modderman et al. | .......... | 355/53 |

FOREIGN PATENT DOCUMENTS

EP   1 037 117 A2   9/2000

* cited by examiner

*Primary Examiner*—Diane I Lee
*Assistant Examiner*—Steven H Whitesell-Gordon
(74) *Attorney, Agent, or Firm*—Pillsbury Winthrop Shaw Pittman LLP

(57) ABSTRACT

Calibration of spot height offsets in a level sensor is performed on a resist-coated substrate to eliminate process dependencies of substrate position measurements obtained by the level sensor.

22 Claims, 3 Drawing Sheets

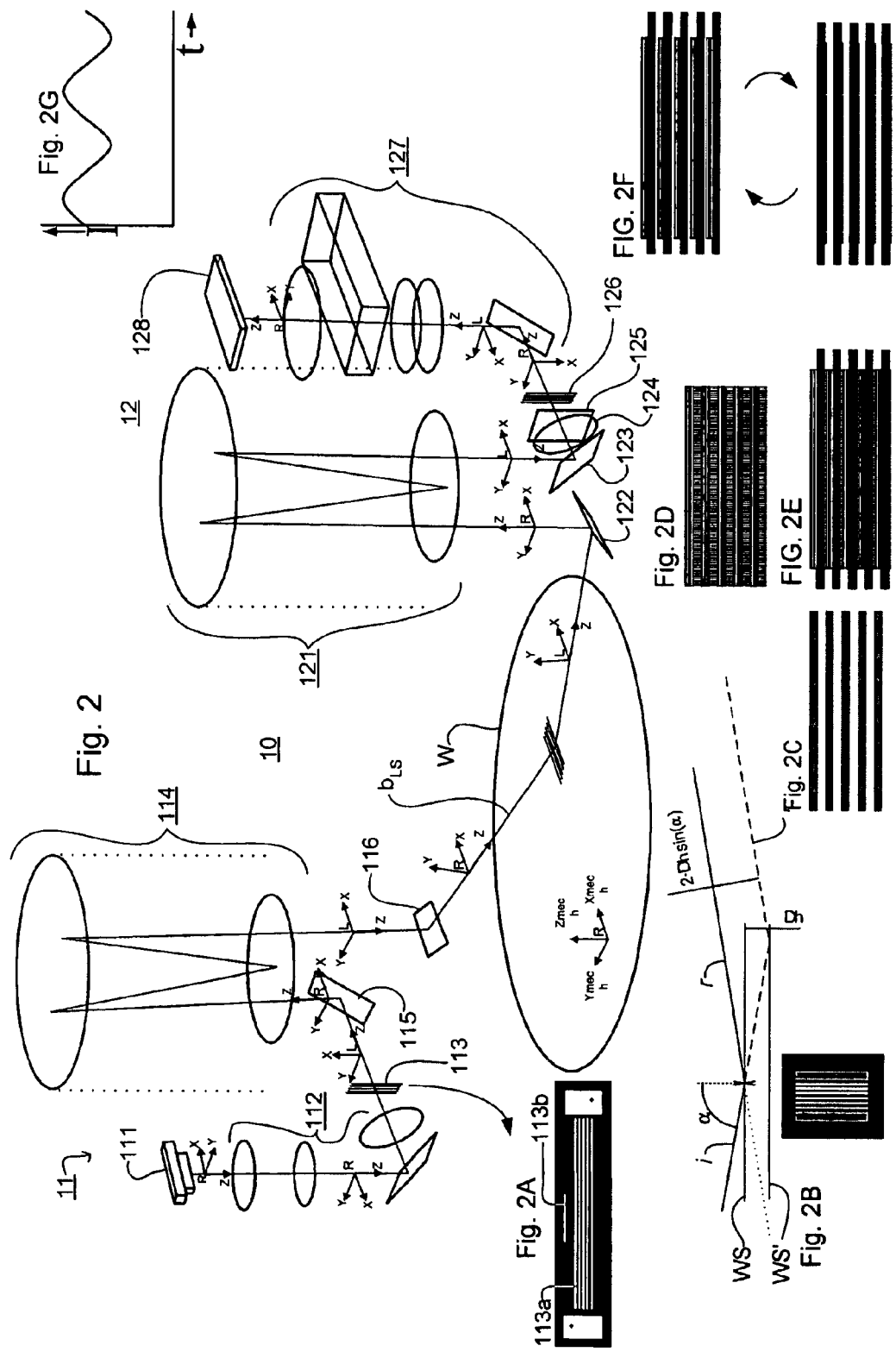

LITHOGRAPHIC APPARATUS, CALIBRATION METHOD, DEVICE MANUFACTURING METHOD AND COMPUTER PROGRAM PRODUCT

FIELD

The present invention relates to lithographic apparatus, calibration methods for lithographic apparatus, device manufacturing methods using lithographic apparatus, and to computer program products.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In almost all lithographic apparatus a level or height sensor is provided. This measures the position of the top surface of a substrate relative to a fixed reference to enable the substrate to be positioned at the correct vertical position (height or Z) and at the correct tilt angle (Rx & Ry) underneath the projection system during an exposure so that the mask image is correctly focused on the substrate across the image field. This process is generally referred to as leveling and may be performed "on-the-fly" or "off-axis". In on-the-fly leveling, the level sensor measures the position of the top surface of the substrate directly underneath the projection system during or immediately before an exposure and a feedback loop adjusts the height and tilt of the substrate as necessary. In off-axis leveling, the surface contour of the substrate to be exposed is mapped in advance (usually by scanning the substrate below a level sensor located away from the optical axis of the projection system but in principle it could be performed with a level sensor mounted on axis) and set points for the substrate table height and tilt and/or adjustable elements of the projection system for an exposure or a series of exposures are calculated in advance.

There are various types of level sensor, including optical sensors and capacitive sensors. In optical sensors a light beam is directed onto the substrate and the reflected light detected. The vertical position of the substrate surface can then be derived in various ways, e.g. by determining the position of the reflected beam on a sensor. In capacitive sensors, the height of the substrate surface is detected using the fact that the capacitance between two surfaces is dependent on the distance between them. Further details of an off-axis leveling scheme and an optical level sensor are given in EP-A-1037117, which document is hereby incorporated in its entirety by reference.

In general, whether on-the-fly or off-axis leveling is used and whether optical or capacitive sensors are used, level sensing systems are configured to measure the height and/or tilt of several points on the substrate surface at the same time, in most cases using several separate sensing devices. In on-the-fly leveling this is necessary to derive tilt information and in off-axis leveling it reduces the time taken to generate the height map. It is therefore necessary to calibrate the different sensing devices relative to one another. Conventionally, this is done using a reference wafer that is assumed to be flat or whose surface profile is known accurately.

SUMMARY

It is desirable to provide an improved method for calibration of level or height sensors in lithographic apparatus.

According to an aspect of the invention, there is provided a device manufacturing method using a lithographic apparatus having a level sensor system including a plurality of level sensor devices configured to measure the position of a surface of a substrate at respective points thereon, the method including: obtaining at least one calibration value for the level sensor, the calibration value compensating for a difference between ones of said plurality of level sensor devices and corresponding to a property of the substrate; measuring the position of the surface of a substrate using the level sensor devices and with reference to the calibration value, the substrate having the property; and exposing the substrate with reference to the measured position of its surface.

According to an aspect of the invention, there is provided a calibration method in a lithographic apparatus having a level sensor system including a plurality of level sensor devices configured to measure the position of the surface of a substrate at respective points thereon, the method including: measuring the position, in a predetermined direction, of a plurality of points on the surface of a substrate with each of said sensor devices, wherein the substrate has thereon a modified surface layer having a predetermined property.

According to an aspect of the invention, there is provided a lithographic apparatus having a level sensor system including a plurality of level sensor devices configured to measure the position of the surface of a substrate at respective points thereon, the level sensor system including a model to relate actual measurements of the level sensor devices to position values and a calibration unit configured to apply a calibration value to the mathematical model that is dependent on a property of a surface layer of a substrate being measured.

According to an aspect of the invention, there is provided a computer program product including program code to control a lithographic apparatus having a level sensor system including a plurality of level sensor devices configured to measure the position of a surface of a substrate at respective points thereon, to perform a device manufacturing method including: obtaining at least one calibration value for the level sensor, the calibration value compensating for a difference between ones of said plurality of level sensor devices and corresponding to a property of the substrate; measuring the position of the surface of a substrate using the level sensor devices and with reference to the calibration value, the substrate having the property; and exposing the substrate with reference to the measured position of its surface.

BRIEF DESCRIPTION OF THE DRAWINGS

Embodiments of the invention will now be described, by way of example only, with reference to the accompanying schematic drawings in which corresponding reference symbols indicate corresponding parts.

FIGS. 2 and 2A to G depict a level sensor included in the lithographic apparatus of FIG. 1.

DETAILED DESCRIPTION

Figure 1:
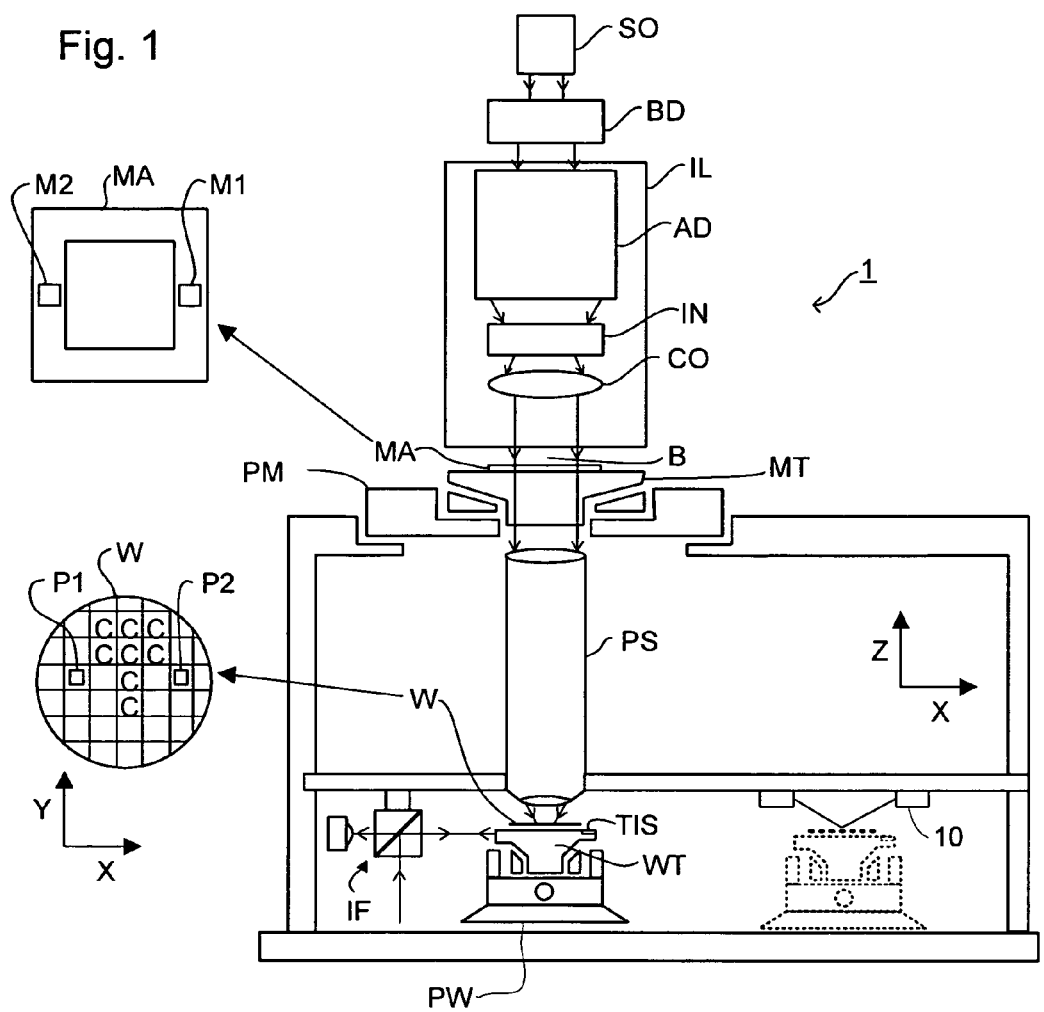
FIG. 1 depicts a lithographic apparatus according to an embodiment of the invention.

FIG. 1 schematically depicts a lithographic apparatus that can be used in one embodiment of the invention. The apparatus includes: an illumination system (illuminator) IL configured to condition a radiation beam B (e.g. UV radiation or DUV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment markers M1, M2 and substrate alignment markers P1, P2. Although the substrate alignment markers as illustrated occupy dedicated target portions, they may be located in spaces between target portions (these are known as scribe-lane alignment markers). Similarly, in situations in which more than one die is provided on the mask MA, the mask alignment markers may be located between the dies.

The depicted apparatus could be used in at least one of the following modes set forth below.

In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The lithographic apparatus may be included in a lithocluster, including process apparatus to perform steps such as etches, deposition, ion implantation, etc. or a fabrication plant or fab including such apparatus and systems for automatically transporting substrates between apparatus. The cluster or fab maybe under computer control.

The lithographic apparatus also includes a level sensor 10, which is illustrated in FIG. 2 and will be explained below additionally with reference to FIGS. 2A to 2G, which show aspects of the operation of the sensor.

Level sensor 10 includes a beam generation branch 11 which directs a measurement beam $b_{LS}$ onto the wafer W (or a physical reference plane when a vertical position of that is being measured, or any reflecting surface) and a detection branch 12 which measures the position of the reflected beam, which is dependent on the vertical position of the wafer surface.

In the beam generation branch, the measurement beam is generated by light source 111, which may be an array of light emitting or laser diodes, or generated elsewhere and passed to "illuminator" 111 by optical fibers. The beam emitted by light source 111 preferably contains a wide band of wavelengths, e.g. from about 600 to 1050 nm, so as to average out any wavelength dependence of interference effects from the wafer surface, particularly after some process steps have been completed. Illumination optics 112, which may include any suitable combination of lenses and mirrors, collect the light emitted by light source 111 and evenly illuminate projection grating 113. Projection grating 113 is shown in greater detail in FIG. 2A and consists of an elongate grating 113a, which may be divided to generate an array of separate/discrete spots, with grating lines parallel to its axis, and an additional aperture 113b which forms a capture spot ahead of the main detection spot array on the wafer. The period of the grating is determined in part by the accuracy at which the wafer surface position is measured and may, for example be about 30 μm. The projection grating is positioned with a small rotation around its optical axis such that the grating lines projected on the wafer are not parallel to any wafer coordinate axis, thereby to avoid interference with structures on the wafer which are along the x or y direction.

Projection lens 114 is a telecentric system which projects an image of the projection grating 113 onto the wafer W. Projection lens 114 preferably consists essentially or only of reflecting optical elements so as to minimize or avoid chromatic aberration in the projected image; since the projection beam is broadband these cannot easily be eliminated or compensated for in a refractive optical system. Folding mirrors 115, 116 are used to bring the projection beam $b_{LS}$ into and out of the projection lens 114 and permit a convenient arrangement of the components of the beam generation branch.

As shown in FIG. 2B, the projection beam $b_{LS}$ is incident on the wafer at a fairly large angle, α, with respect to the normal, e.g. in the range of from 60° to 80°, and is reflected into the detection branch 12. If the wafer surface WS shifts in position by a distance Dh to position WS', the reflected beam r' shifts relative to the beam r, by a distance 2Dh.sin(α). FIG. 2B also shows the appearance of the image on the wafer surface; because of the large angle of incidence, the image is spread out perpendicular to the grating lines.

The reflected beam is collected by detection optics 121 and focused on detection grating 126, which is preferably substantially the same as projection grating 113 and is subdivided to correspond to the spot-array pattern. Detection optics 121 are directly complementary to projection optics 114 and preferably also consists essentially or only of reflective elements, to minimize chromatic aberration. Again folding mirrors 122, 123 may be used to enable a convenient arrangement of the components. Between detection optics 121 and detection grating 126 are positioned a linear polarizer 124 to polarize the light at 45° and a birefringent crystal 125 which causes a shear perpendicular to the grating lines equal in magnitude to the grating period between the horizontal and vertical polarized components of the light. FIG. 2C shows the beam as it would appear at the detection grating 126 without the birefringent crystal; it is a series of alternating light and dark bands with the light bands representing light that is polarized at 45°. Birefringent crystal 125 causes shifts in the horizontal and vertical polarization states so that the light bands of the horizontal polarization component fill the dark bands of the vertical polarization component. As shown in FIG. 2D, the illumination at detection grating 126 is therefore uniform in intensity but the light incident on grating 126 actually consists of stripes of alternating horizontal and vertical polarization states. FIG. 2E shows the detection grating 126 overlaid on this pattern, which depends on the vertical position of the wafer surface; when the wafer is at a nominal zero vertical position, detection grating 126 overlies and blocks half of the light bands of one polarization state and half of the other state.

The light passed by detection grating 126 is collected by modulation optics 127 and focused on detector 128. Modulation optics include a polarization modulation device driven by an alternating signal, e.g. with a frequency of about 50 kHz, so as to pass the two polarization states alternately. The image seen by the detector 128 therefore alternates between the two states shown in FIG. 2F. Detector 128 is divided into a number of regions corresponding to the array of spots whose height is to be measured. The output of a region of detector 128 is shown in FIG. 2G. It is an alternating signal with period equal to that of the modulation optics and the amplitude of the oscillations indicates the degree of alignment of the reflected image of the projection grating on the detection grating, and hence the vertical position of the wafer surface. As mentioned above, if the wafer surface is at the nominal zero position, detection grating 126 blocks out half of the vertical polarization state and half of the horizontal polarization state. In this case, modulation optics 127 have no effect on the intensity of light incident on detector 128, since both vertical and horizontal polarization components exiting grating 126 are equal. Thus, the measured amplitude of oscillating signals output by the detector regions is zero. As the vertical position of the wafer surface moves away from the zero position, detection grating 126 passes more of one component, for example, the horizontally polarized bands, and blocks more of the vertically polarized bands. The amplitude of the oscillations increases accordingly. The amplitude of the oscillations, which is a measure of the vertical position of the wafer surface, is not directly linearly related to the vertical position of the wafer surface in nanometers. However, a correction table or formula can readily be determined on initial setup of the apparatus to establish a relationship between the measured amplitude and vertical wafer position (and periodically recalibrated if necessary). In the past, calibration has been done by measuring the constant height of the surface of a bare silicon wafer at various different vertical positions of the substrate table, using the calibrated Z-interferometer and uncalibrated level sensor 10. This calibration also involves determining the differences between the different detector regions, which are known as relative spot offset heights. These offsets derive from uncorrectable variations in the optics of the level sensor, the alignment of the reference and detection gratings, the detector regions, etc. which have the effect that if the same height is measured using two different detector spots, different results are obtained.

Figure 3:
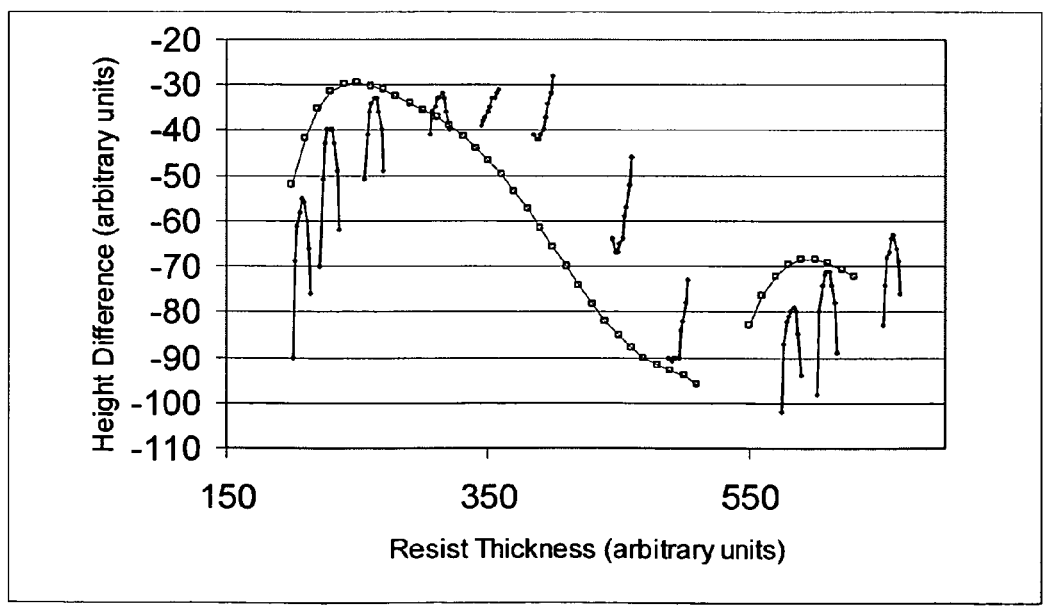
FIG. 3 is a graph showing sensor to sensor height measurement variation with resist thickness.

The present inventors have discovered that, in addition to the known process dependency of height measurements, where a height or level sensor system includes multiple sensor devices, even nominally identical ones, the offsets between level sensor devices can vary with changes in the structure and materials underlying the surface being measured. For example, for optical sensors such as that described above, in addition to positional shifts of a wafer, reflections from layer boundaries underneath the top surface can cause changes in the sensor output leading to errors—these errors vary according to the thicknesses and materials of the underlying layers. This is shown in FIG. 3, which shows how average and extreme errors in level sensor output vary with thickness of a resist coating applied to a wafer being measured. This type of phenomenon is generally referred to as a process dependency, since the height measurement depends on previous processes that have been applied to the substrate.

In FIG. 3, each narrow broken curve represents a series of about eight nominal height difference measurements each taken at a single resist thickness, using different spots in a level sensor of the type described above. The actual height difference corresponding to each broken curve is represented by square symbols of the two longer curves that lies above or below the corresponding broken curve. It can be seen that the offsets between spots change substantially in both sign and magnitude as the resist thickness varies and that these changes are not obviously systematic. In other words, at one resist thickness, a first spot position may produce a larger height difference than a second spot position (compare, for example, the fifth and eighth data point at ~200 au resist thickness), while at another resist thickness, the first spot position produces a smaller height difference than the second spot position (compare, for example, the fifth and eighth data point at ~450 au resist thickness). The inventors have also determined that the spot offsets can vary with resist type and with changes in the layers lying below the resist, both anti-reflection coatings (BARC) and process layers.

Although the data shown in FIG. 3 is based on optical sensor measurements, other sensors, such as capacitive sensors, are also sensitive to—the surface region of a substrate. Accordingly, changes in substrate surface layers such as changes in resist thickness, or addition of metallic layers, can cause the apparent position of a substrate held at a fixed position to vary, and therefore can cause substantial errors in measurement of properties such as substrate height, whether the measurements are performed by optical or capacitive methods.

To address this problem, in one embodiment of the present invention, rather than rely on an initial or periodically repeated calibration of the level sensor spots carried out using a bare silicon reference wafer, offset (calibration) values are determined for different types and/or thicknesses of resist and/or underlying layers. For height measurements in production, the offset values appropriate to the actual layer structure on the substrate being measured are employed. The inventors have determined that the incorrect offset values used in the past have resulted in focus errors of the order of 7 to 15 nm, and in some cases up to 45 nm, in edge dies—that is, die that do not completely fit on the substrate but which are nevertheless imaged because the partial die contains complete devices or to avoid processing variations in the dies adjacent to the edge dies and substrate warpage. Focus errors such as these can be avoided with the present invention.

Figure 4:
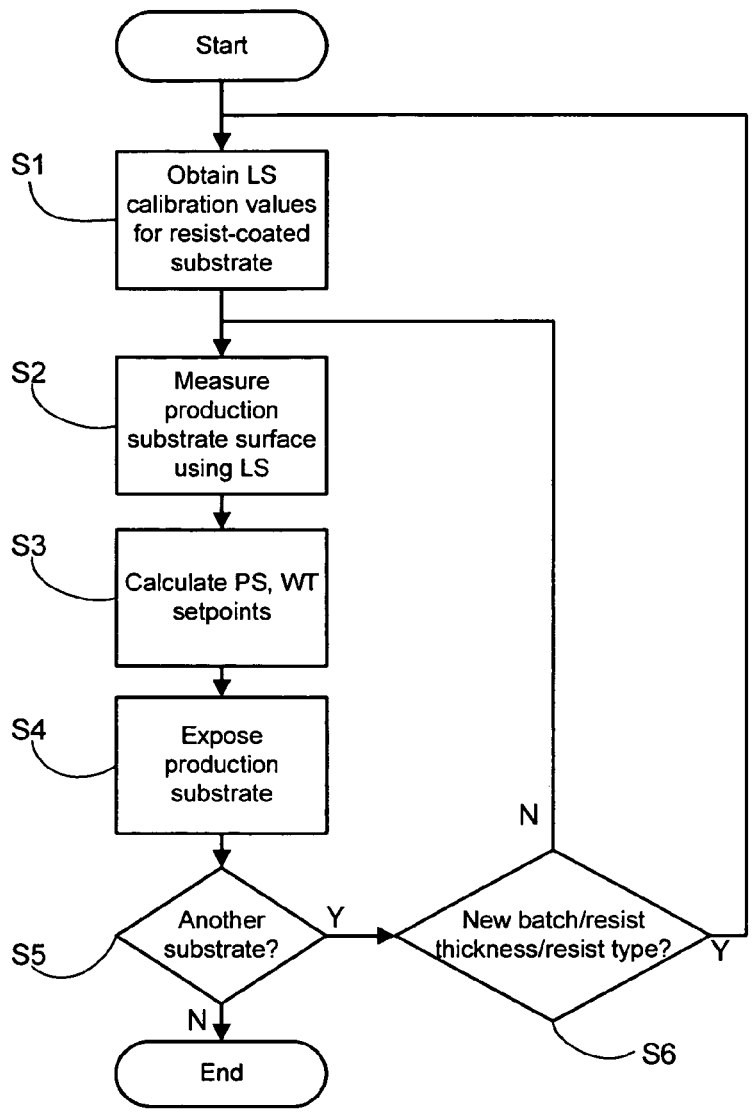
FIG. 4 depicts a device manufacturing method according to an embodiment of the invention.

A flowchart of a device manufacturing method according to an embodiment of the invention is shown in FIG. 4. In the first step, S1, calibration values (e.g. spot offsets) for the level sensor (LS) 10 appropriate to a resist coated substrate are obtained. This may be done by performing a calibration procedure (described further below) on a substrate that is about to be exposed, e.g. the first in a batch or lot, by looking values up in a table or database derived from multiple calibrations carried out in advance, by interpolating and/or extrapolating from stored values or by a combination of these approaches. Previously stored calibration values may be obtained by performing multiple calibrations on the particular apparatus in which they are to be used or may be calculated by combining calibrations on the particular apparatus and measurements taken on equivalent apparatus.

In general, calibration values can be selected with reference to any relevant property of a layer in or on the surface of the substrate. For example the property may relate to the thickness of the layer and calibration values may be selected based on the nominal thickness of the layer or for a range of thickness values of the layer. Alternatively or in addition, the property may relate to the material of the layer of its topology (three-dimensional structure). The layer may be resist, an anti-reflective coating, or a product layer.

Next, in step S2, a height-map of a resist-coated production substrate is taken and, in step S3, setpoints for the substrate table WT and/or any relevant adjustable parameters of the projection system PS are calculated, using, for example, procedures described in EP-A-1037117 referenced above. The production exposure can then proceed, in step S4. After completion of exposures on one substrate, in most cases additional substrates are exposed. In step S5 it is determined whether or not that is the case and, if so, it is determined in step S6 whether the next substrate is of a different batch and/or has a different resist type and/or thickness. If the next substrate is of the same batch, from which it generally follows that it has the same resist type and thickness, or is a different batch but has the same resist type and thickness, the height mapping, calculating and exposure steps S2 to S5 can continue using the same calibration values for the level sensor. However, if there is a change of batch resist type or resist thickness, the process returns to step S1, where a new set of calibration values is obtained for the new resist type and/or thickness before the height mapping, calculating and exposure steps S2 to S5 are performed for the new substrate. Note that if determination of a new set of calibration values can be performed without loss of throughput, or if the loss of throughput is acceptable for the yield gain obtained, it is possible to do a recalibration of the level sensor on each production substrate, regardless of whether there is a change of batch, resist type or thickness. Should, for some reason, the resist type or thickness or the underlying structure vary across a single substrate sufficiently to affect the level sensor calibration, different level sensor calibration values can be used when measuring the height of different parts of the substrate.

Figure 5:
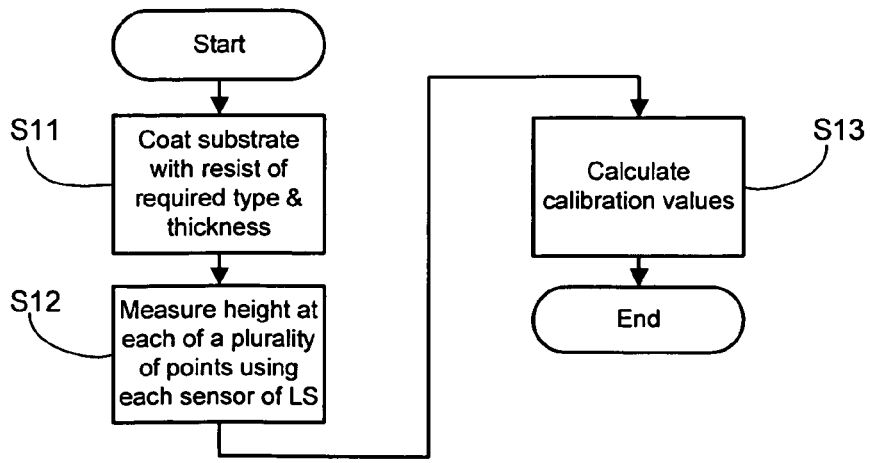
FIG. 5 depicts a calibration method according to an embodiment of the invention.

A method of determining the calibration values is shown in FIG. 5. The procedure outlined in FIG. 5 differs from conventional procedures in that a resist-coated substrate is used rather than a bare reference substrate. The method shown in FIG. 5 has three steps: first, in step S11, a substrate is coated with a resist layer of the relevant type and thickness; secondly, in step S12, the height of a plurality of points is measured, each point being measured by each sensor device or spot in the sensor system being calibrated; and thirdly, in step S13, the calibration values are calculated from the measurement data.

The substrate used for the calibration may be a reference substrate which is stripped of resist and recoated with a new resist type or thickness if a library of calibration data is being obtained. Alternatively, a production substrate that is about to be exposed may be used, if the calibration values are determined for each substrate, batch of substrates or series of similar batches. The plurality of points that is measured is preferably large enough to ensure a statistically valid result and may span an entire die. It may also be desirable to measure each point several times with some or all sensor devices or spots with the substrate table at a different vertical position relative to the sensor, to determine any variation across the measurement range of each sensor device. How the calibration values are calculated depends on how they are used in the level sensor models, however relative spot height offsets may be determined by designating one sensor device to be a reference and for each other device calculating an average of the difference in height measured by that sensor device and the reference device for each point. As an alternative, an additional sensor, perhaps of a different type such as an air gauge, may be used as a reference.

Software to implement the methods of the invention may be included in the control systems of newly constructed lithographic apparatus or coded as an upgrade to be applied to existing apparatus, i.e. retrofitted.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A device manufacturing method using a lithographic apparatus having a projection system and a level sensor system comprising a plurality of level sensor devices, the projection system configured to expose a substrate and each level sensor device configured to project a beam of light patterned by a respective grating of the level sensor device onto a surface of the substrate to be exposed, such that a surface height of the substrate is measured by the level sensor devices by detecting properties of a resulting image of the grating at respective points thereon, the method comprising:

obtaining at least one calibration value for the level sensor system, the at least one calibration value compensating for a difference in measured surface heights among said plurality of level sensor devices, the at least one calibration value corresponding to a property of the substrate to be exposed;

determining measured and calibrated surface heights of the substrate to be exposed using the plurality of level sensor devices based on the at least one calibration value; and, thereafter, exposing the substrate using the projection system based on the measured and calibrated surface heights.

2. The method according to claim 1, wherein the property relates to the thickness of a layer disposed in or on the surface.

3. The method according to claim 2, wherein the property is a nominal thickness value of the layer.

4. The method according to claim 2, wherein the property is a range of thickness values of the layer.

5. The method according to claim 2, wherein the layer is a layer selected from the group consisting of: resist, anti-reflective coatings, and product layers.

6. The method according to claim 1, wherein the property relates to the material properties of a layer disposed in or on the surface.

7. The method according to claim 6, wherein the layer is a layer selected from the group consisting of: resist, anti-reflective coatings, and product layers.

8. The method according to claim 1, wherein the property relates to the topology of a layer disposed in or on the surface.

9. The method according to claim 1, wherein obtaining the at least one calibration value comprises carrying out a calibration process when a resist layer having the property is disposed on the substrate.

10. The method according to claim 9, wherein the calibration process comprises measuring the position of a plurality of points on the surface of the substrate in a direction perpendicular to a nominal plane of the substrate using each of said level sensor devices.

11. The method according to claim 1, wherein obtaining the at least one calibration value comprises looking up a calibration value in a table of calibration values corresponding to different properties.

12. The method according to claim 1, wherein obtaining the at least one calibration value comprises calculating the at least one calibration value using a mathematical model of which the property is a parameter.

13. The method according to claim 1, wherein the level sensor devices are optical sensors.

14. The method according to claim 1, wherein the at least one calibration value is determined by air gauges.

15. A calibration method in a lithographic apparatus having a projection system and a level sensor system comprising a plurality of level sensor devices, the projection system configured to expose a substrate and each level sensor device configured to project a beam of light patterned by a respective grating of the level sensor device onto a surface of the substrate to measure a surface height of the substrate by detecting properties of a resulting image of the grating at respective points thereon, the method comprising:

obtaining surface heights at a plurality of points on a surface of the substrate to be exposed, measuring the surface heights at the plurality of points on the surface of the substrate to be exposed using each of said level sensor devices, comparing corresponding obtained and measured surface heights and calculating corresponding calibration values, the calibration values corresponding to a property of the substrate;

wherein the substrate has thereon a modified surface layer having a predetermined property.

16. The calibration method according to claim 15, wherein the modified surface layer comprises at least one of the group consisting of resist layers, anti-reflective coatings, and product layers.

17. The method according to claim 15, wherein the predetermined property is a thickness range.

18. The method according to claim 15, wherein the predetermined property is a nominal thickness value.

19. The method according to claim 15, wherein the property is a resist type.

20. The method according to claim 15, further comprising, repeating the method for a plurality of substrates, each having a predetermined property associated therewith and wherein the predetermined property associated with a first substrate of the plurality of substrates is different from the predetermined property associated with a second substrate of the plurality of substrates.

21. A lithographic apparatus having a level sensor system comprising a plurality of level sensor devices, each level sensor device configured to project a beam of light patterned by a respective grating of the level sensor device onto a surface of a substrate in order to measure a surface height of the substrate by detecting properties of a resulting image of the grating at respective points thereon, the level sensor system including a model to relate actual measurements of the level sensor devices to the predetermined surface heights, and a calibration unit configured to apply a calibration value of the model, the calibration value dependent on a property of a surface layer of a substrate being measured and wherein the calibration value is determined for a substrate that is about to be exposed using a projection system.

22. A computer program stored on a computer readable medium comprising program code to control a lithographic apparatus having a projection system and a level sensor system comprising a plurality of level sensor devices, the projection system configured to expose a substrate and each level sensor device configured to project a beam of light patterned by a respective grating of the level sensor device onto a surface of the substrate to be exposed, such that a surface height of the substrate is measured by the level sensor devices by detecting properties of a resulting image of the grating at respective points thereon, the computer program comprising:

obtaining at least one calibration value for the level sensor system, the at least one calibration value compensating for a difference in measured surface heights by said plurality of level sensor devices and predetermined respective surface heights, corresponding to a property of the substrate to be exposed;

measuring the surface heights of the substrate to be exposed using the level sensor devices based on the at least one calibration value; and, thereafter, exposing the substrate using the projection system based on the measured heights of its surface.

* * * * *